United States Patent
Xiong et al.

(10) Patent No.: US 9,564,460 B1
(45) Date of Patent: Feb. 7, 2017

(54) THIN-FILM TRANSISTOR AND ITS MANUFACTURING METHOD, ARRAY SUBSTRATE AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Shengnan Xiong, Beijing (CN); Yunyou Zheng, Beijing (CN); Wei Li, Beijing (CN); Yicun Zhang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/155,403

(22) Filed: May 16, 2016

(30) Foreign Application Priority Data

Sep. 18, 2015 (CN) .......................... 2015 1 0601156

(51) Int. Cl.
| | |
|---|---|
| H01L 21/00 | (2006.01) |
| H01L 21/84 | (2006.01) |
| H01L 27/12 | (2006.01) |
| H01L 29/66 | (2006.01) |
| H01L 21/306 | (2006.01) |
| H01L 21/308 | (2006.01) |
| H01L 21/3213 | (2006.01) |
| H01L 21/027 | (2006.01) |
| H01L 29/786 | (2006.01) |

(52) U.S. Cl.
CPC ....... *H01L 27/1288* (2013.01); *H01L 21/0274* (2013.01); *H01L 21/3081* (2013.01); *H01L 21/30604* (2013.01); *H01L 21/32135* (2013.01); *H01L 21/32139* (2013.01); *H01L 27/1222* (2013.01); *H01L 29/66765* (2013.01); *H01L 29/78669* (2013.01); *H01L 29/78678* (2013.01)

(58) Field of Classification Search
CPC .......... H01L 27/1288; H01L 29/78678; H01L 29/66765; H01L 21/30604; H01L 27/1222; H01L 21/32139; H01L 21/32135; H01L 29/78669; H01L 21/3081; H01L 21/0274
See application file for complete search history.

(56) References Cited

U.S. PATENT DOCUMENTS

| | | | | |
|---|---|---|---|---|
| 5,462,891 | A * | 10/1995 | Okada ............... | H01L 29/66765 216/100 |
| 2007/0153151 | A1* | 7/2007 | Yang ................. | G02F 1/136227 349/43 |
| 2013/0309821 | A1* | 11/2013 | Yoo .................... | H01L 27/1288 438/158 |

* cited by examiner

*Primary Examiner* — Thanh Y Tran
(74) *Attorney, Agent, or Firm* — Ladas & Parry LLP

(57) ABSTRACT

A manufacturing method of a thin film transistor comprises: sequentially forming a pattern of gate, a gate insulation layer film, an active layer film and an ohmic contact layer film, a first etching resist module within a channel region to be formed, and a source and drain metallic layer film on a substrate; forming a pattern comprising the source and drain by wet etching process by shielding the active layer film and the ohmic contact layer film positioned within the channel region to be formed, by use of the first etching resist module; and forming a pattern comprising the ohmic contact layer and the active layer by dry etching process. A thin film transistor, an array substrate comprising the thin film transistor and a display device comprising the array substrate are also disclosed.

15 Claims, 5 Drawing Sheets

THIN-FILM TRANSISTOR AND ITS
MANUFACTURING METHOD, ARRAY
SUBSTRATE AND DISPLAY DEVICE

TECHNICAL FIELD

Embodiments of the present disclosure relate to a thin-film transistor and its manufacturing method, an array substrate and a display device.

BACKGROUND

Typically, Thin Film Transistor (TFT) plays a very important role in an array substrate.

In conventional method of manufacturing a thin film transistor, in the process of depositing a source/drain metal layer and etching the source/drain metal layer so as to form source/drain electrodes, the source/drain metal layer is subject to one wet etching and one dry etching, wherein in the dry etching process, there are various drawbacks during etching the source and drain metallic layer corresponding to the channel region. For example, it is difficult for the dry etching apparatus to etch the metallic layer, the etching is not uniform, a great loss occurs to the apparatus, the yield is low and it is difficult to be applied for mass production.

SUMMARY

At least one embodiment of the present disclosure provides a manufacturing method of a thin film transistor, comprising: sequentially forming a pattern of gate, a gate insulation layer film, an active layer film and an ohmic contact layer film on a substrate;
forming a first etching resist module, which covers a channel region to be formed, on the ohmic contact layer film;
forming a source and drain metallic layer film on the substrate formed with the first etching resist module;
forming a pattern comprising a source and drain on the source and drain metallic layer film by wet etching process by shielding the active layer film and the ohmic contact layer film within the channel region to be formed through the first etching resist module; and
forming a pattern of an ohmic contact layer in the ohmic contact layer film and forming a pattern of an active layer in the active layer film, by dry etching process.

At least one embodiment of the present disclosure further provides a thin film transistor manufactured by the manufacturing method according to the above embodiment of the present disclosure.

At least one embodiment of the present disclosure further provides an array substrate comprising the thin film transistor according to the above embodiment of the present disclosure.

At least one embodiment of the present disclosure further provides a display device comprising the array substrate according to the above embodiment of the present disclosure.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

DETAILED DESCRIPTION

Figure 1:
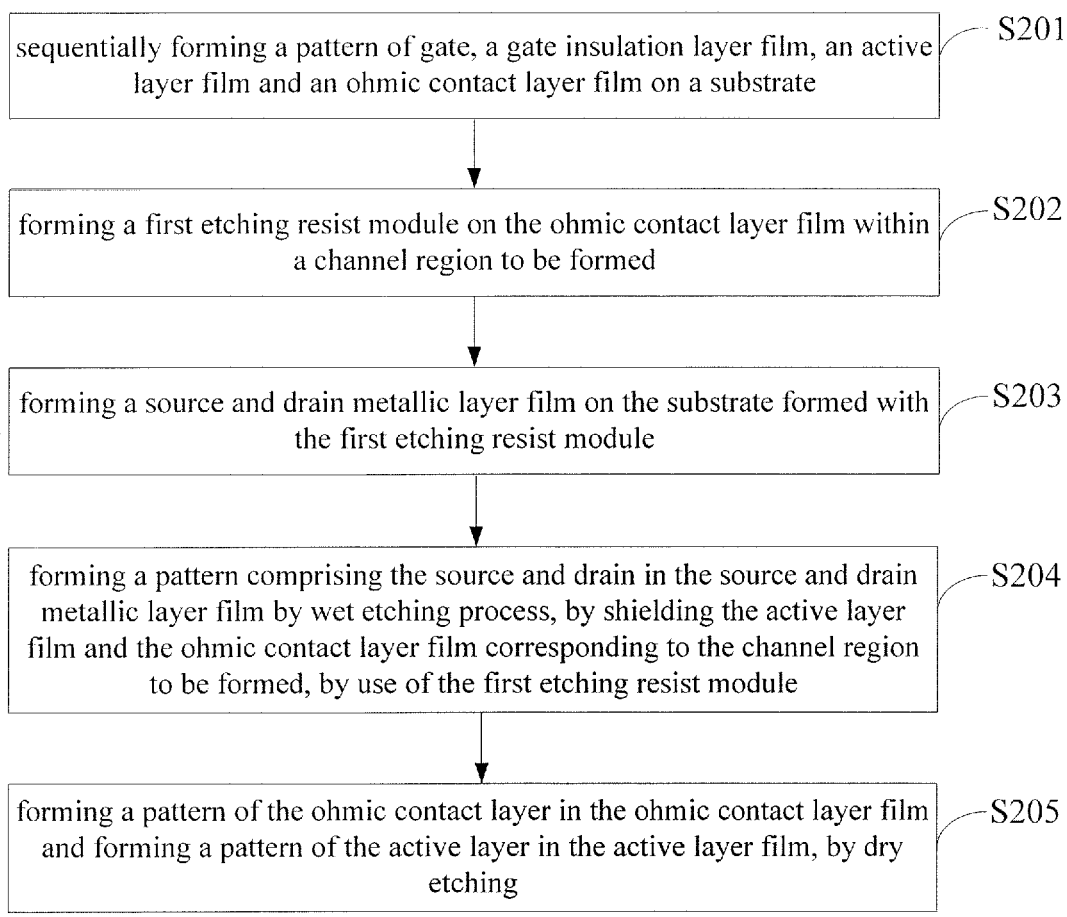
FIG. 1 is a flow chart of the manufacturing method of the thin film transistor according to the embodiments of the present disclosure.

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

In the drawings, the thicknesses and the shapes of various film layers do not reflect a real proportion of the thin film transistor, but are only intended to illustratively describe the contents of the present disclosure.

At least one embodiment of the present disclosure provides a manufacturing method of thin film transistor, as illustrated in FIG. 1, comprising:
S201: sequentially forming a pattern of gate, a gate insulation layer film, an active layer film and an ohmic contact layer film on a substrate;
S202: forming a first etching resist module, which covers a channel region to be formed, on the ohmic contact layer film;
S203: forming a source and drain metallic layer film on the substrate formed with the first etching resist module;
S204: shielding by means of the first etching resist module the active layer film and the ohmic contact layer film positioned within the channel region to be formed, and forming a pattern comprising the source and drain in the source and drain metallic layer film by wet etching process;
S205: forming a pattern of the ohmic contact layer in the ohmic contact layer film and forming a pattern of the active layer in the active layer film, by dry etching process.

In the above manufacturing method of the thin film transistor according to the embodiments of the present disclosure, the method comprises: firstly, sequentially forming a pattern of gate, a gate insulation layer film, an active layer film and an ohmic contact layer film on a substrate; and then forming a first etching resist module, which covers a channel region to be formed, on the ohmic contact layer film; and then, forming a source and drain metallic layer film on the substrate formed with the first etching resist module; by use of the first etching resist module, shielding the active layer film and the ohmic contact layer film positioned within the channel region to be formed, forming a pattern comprising the source and drain in the source and drain metallic layer film by wet etching process; finally, forming a pattern of the ohmic contact layer in the ohmic contact layer film and forming a pattern of the active layer in the active layer film, by dry etching process. In the manufacturing method according to the embodiments of the present disclosure, on the basis that the first etching resist module can protect the active layer film within the channel region to be formed, the pattern comprising the source and drain is formed just by wet etching process performed on the source and drain metallic layer. The etching is uniform and problems that the etching is not uniform, a great loss occurs to the apparatus and the yield is low when the source and drain metallic layer is subjected to dry etching process are eliminated.

When implementing the above manufacturing method of the thin film transistor according to the embodiments of the present disclosure, to simplify the process, the step S202 of forming a first etching resist module, which covers a channel region to be formed, on the ohmic contact layer film can be implemented as follows:

forming a first photoresist layer film on the ohmic contact layer film, exposing and developing the first photoresist layer film and obtaining a first photoresist completely maintained region and a first photoresist completely removed region; wherein the first photoresist completely maintained region covers the channel region, and the first photoresist completely removed region exposes regions except the channel region; at this time, the photoresist in the first photoresist completely maintained region of the first photoresist layer film can be used as the first etching resist module.

For example, when material for the first etching resist module is photoresist, only an exposing and developing process is needed to form a pattern of the first etching resist module, while no etching process is required, thereby simplifying the process, saving cost and reducing waste of resources.

Figure 2:
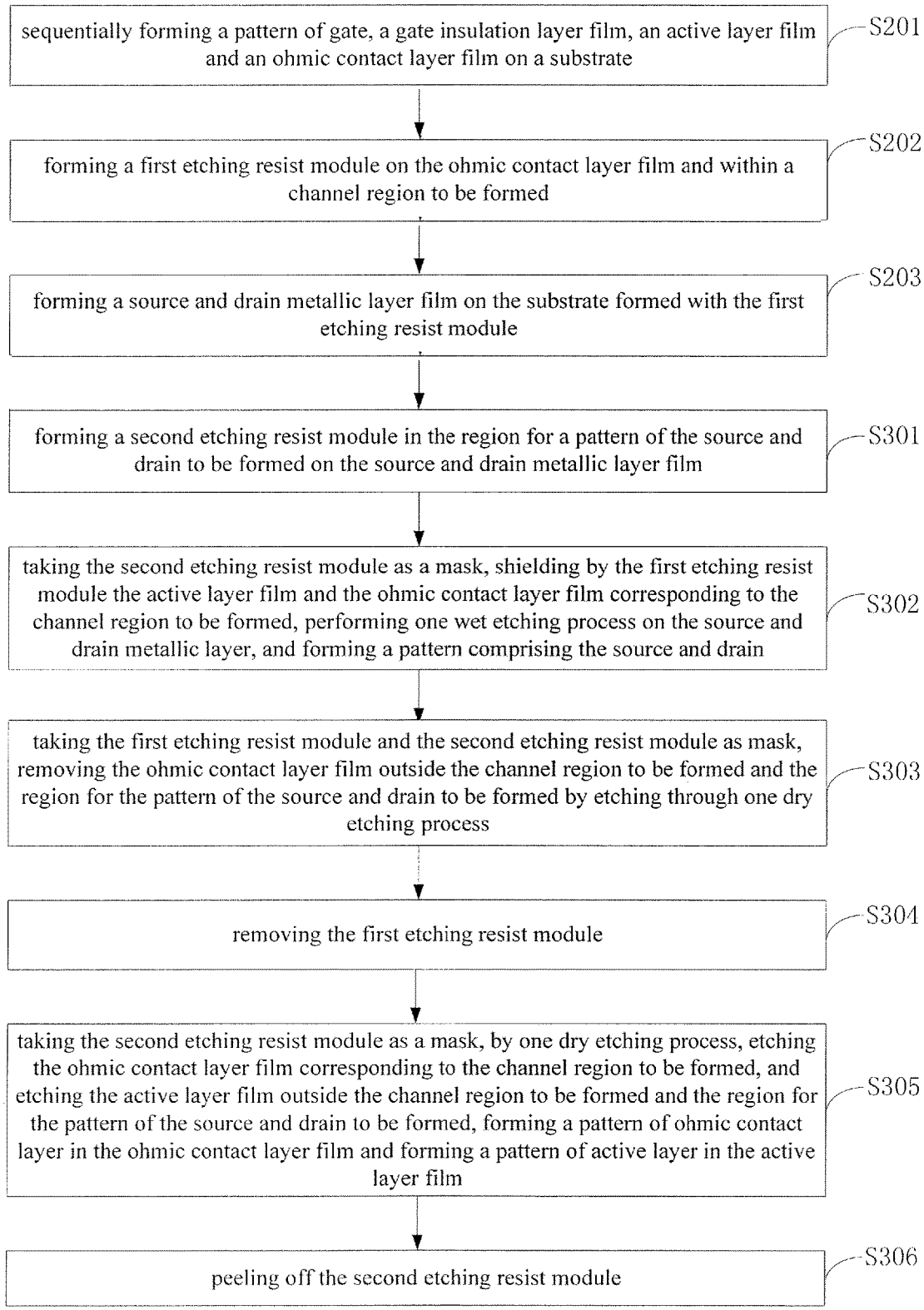
FIG. 2 is another flow chart of the manufacturing method of the thin film transistor according to the embodiments of the present disclosure.

When implementing the above manufacturing method of the thin film transistor according to the embodiments of the present disclosure, to ensure that a pattern comprising the source and drain can be formed by means of wet etching process, as illustrated in FIG. 2, the step S204 of shielding by the first etching resist module the active layer film and the ohmic contact layer film positioned within the channel region to be formed, and forming a pattern comprising the source and drain in the source and drain metallic layer film by wet etching process can be implemented as follows:

S301: forming a second etching resist module, which covers the region for a pattern of the source and drain to be formed, on the source and drain metallic layer film;

S302: taking the second etching resist module as a mask, shielding by the first etching resist module the active layer film and the ohmic contact layer film positioned within the channel region to be formed, performing wet etching process once on the source and drain metallic layer, and forming a pattern comprising the source and drain.

For example, the first resist module and the second resist module as provided can effectively prevent the film layer from being damaged during etching process. The first resist module can protect the active layer film and the ohmic contact layer film (portions which are not to be etched) corresponding to the channel region to be formed, and the second resist module can make the source and drain metallic layer (portions which are to be etched) within the channel region to be formed fully exposed, which facilitates performing the wet etching process in the step S302 and forming of the pattern of the source and drain. Problems of etching being not uniform and loss occurring to the apparatus being great will not exist any more.

When implementing the above manufacturing method of the thin film transistor according to the embodiments of the present disclosure, to simplify the process, the step S301 of forming a second etching resist module, which covers the region for a pattern of the source and drain to be formed, on the source and drain metallic layer film can be implemented as follows:

forming a second photoresist layer film on the source and drain metallic layer film, exposing and developing the second photoresist layer film and obtaining a second photoresist completely maintained region and a second photoresist completely removed region; wherein the second photoresist completely maintained region covers the region for a pattern comprising the source and drain to be formed, and the second photoresist completely removed region exposes regions except the region for a pattern of the source and the drain to be formed; at this time, the photoresist in the second photoresist completely maintained region of the second photoresist layer film can be used as the second etching resist module.

For example, when material for the second etching resist module is photoresist, only an exposing and developing process is required to form a pattern of the second etching resist module, while no etching process is required, thereby simplifying the process, saving cost and reducing waste of resources.

When implementing the above manufacturing method of the thin film transistor according to the embodiments of the present disclosure, to simplify the process, the process in the step S205 of forming a pattern of the ohmic contact layer in the ohmic contact layer film and forming a pattern of the active layer in the active layer film can be implemented as follows:

S303: taking the first etching resist module and the second etching resist module as masks, removing the ohmic contact layer film outside the channel region to be formed and the region for a pattern of the source and drain to be formed by etching through one dry etching process;

S304: removing the first etching resist module;

S305: taking the second etching resist module as a mask, etching the ohmic contact layer film within the channel region to be formed by one dry etching process, and etching the active layer film outside the channel region to be formed and a region for the pattern of the source and drain to be formed, forming a pattern of ohmic contact layer in the ohmic contact layer film and forming a pattern of active layer in the active layer film.

For example, firstly, by one dry etching process, etching is performed on the ohmic contact layer film outside the channel region to be formed and the region for the pattern of the source and drain to be formed, and then the first etching resist module is removed, and finally by one dry etching process, etching is performed on the ohmic contact layer film within the channel region to be formed and on the active layer film outside the channel region to be formed and the region for the pattern of the source and drain to be formed, thus forming a pattern of the active layer and a pattern of the ohmic contact layer simultaneously. Through the above steps, the overall time is shortened, raw materials are saved, process interval is reduced compared with conventional process, and the yield is improved.

When implementing the above manufacturing method of the thin film transistor according to the embodiments of the present disclosure, the step S304 of removing the first etching resist module can be carried out as follows:

ashing process is performed on the first etching resist module; at this time, ashing process is performed in a case that the material for the first etching resist module is photoresist.

When implementing the above manufacturing method of the thin film transistor according to the embodiments of the present disclosure, after forming a pattern of the ohmic contact layer in the ohmic contact layer film and a pattern of the active layer in the active layer film, the step S305 can further comprises:

S306: peeling off the second etching resist module. At this time, peeling is performed in a case that the material for the second etching resist module is photoresist. After the second etching resist module has been peeled off, a finished pattern of the source and the drain without residue can be obtained.

The manufacturing method of the thin film transistor according to the embodiments of the present disclosure is described below in detail by an example. The method comprises the following step.

Step One: forming sequentially a pattern of gate, a gate insulation layer film, an active layer film and an ohmic contact layer film on a substrate.

Figure 3A:
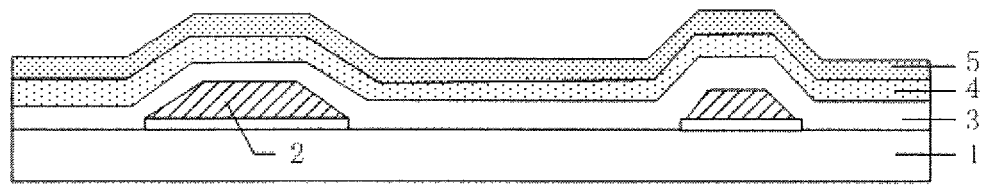
FIG. 3a to FIG. 3i are respectively illustrative structural views after each respective step is performed according to the manufacturing method of the thin film transistor provided by the embodiments of the present disclosure.

When implementing the manufacturing method, as illustrated in FIG. 3a, a gate metallic film is first deposited on the substrate 1 by spattering or thermal evaporation method. Material for the gate metallic film can be selected from metals of Cr, Cu, Ti, Ta, Mo and the like or an alloy thereof. A gate metallic film composed of multilayered metal can also meet the requirement. After one lithography process, a pattern of gate 2 is formed. And then, a gate insulation layer film 3 having a certain thickness is deposited by plasma enhanced chemical vapor deposition (PECVD) method. Material for the gate insulation layer film 3 can be selected from oxide, nitride or nitrogen oxides. Next, an active layer film 4 having a certain thickness is deposited on the gate insulation layer film 3 by spattering or thermal evaporation method. The active layer film 4 can be a metallic oxide semiconductor layer which can be made of amorphous silicon, polycrystalline silicon, microcrystalline silicon or other oxide semiconductor layer material. And then, an ohmic contact layer film 5 having a certain thickness is deposited on the active layer film 4 by spattering or thermal evaporation method. The ohmic contact layer film 5 can be of a-Si:H film of n+ type.

Step Two: forming a first etching resist module on the ohmic contact layer film within the channel region to be formed.

Figure 3B:
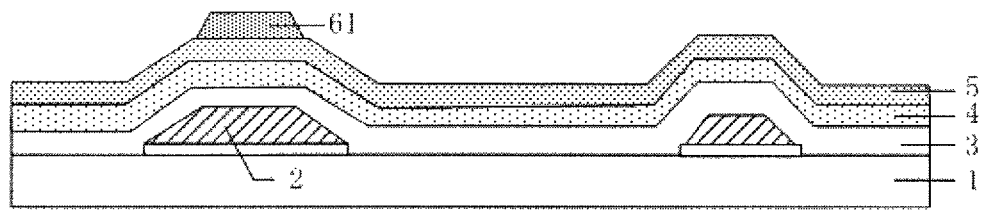

When implementing the manufacturing method, as illustrated in FIG. 3b, a first photoresist (PR) layer film having a certain thickness is deposited by PECVD method on the substrate 1 which has been subjected to Step One. After one exposing and developing, a first photoresist completely maintained region and a first photoresist completely removed region are obtained; wherein the first photoresist completely maintained region covers the channel region, and the first photoresist completely removed region exposes other regions except the channel region; at this time, the photoresist in the first photoresist completely maintained region of the first photoresist layer film can be used as the first etching resist module 61.

Step Three: forming a source and drain metallic layer film on the substrate formed with the first etching resist module.

Figure 3C:
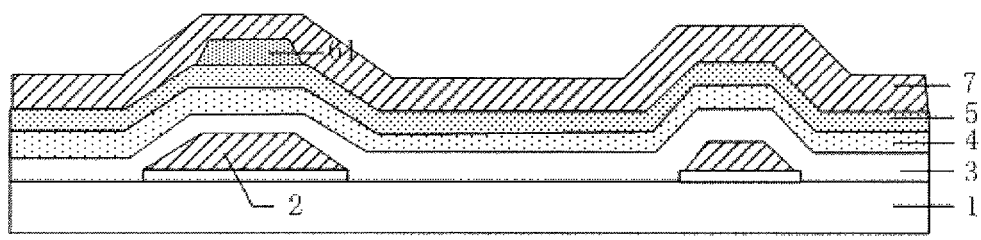

When implementing the manufacturing method, as illustrated in FIG. 3c, a metallic film layer having a certain thickness is plated on the substrate which has been subjected to Step Two by spattering or thermal evaporation method as a source and drain metallic layer film 7.

Step Four: forming a second etching resist module, which covers the region for a pattern of the source and drain to be formed, on the source and drain metallic layer film.

Figure 3D:
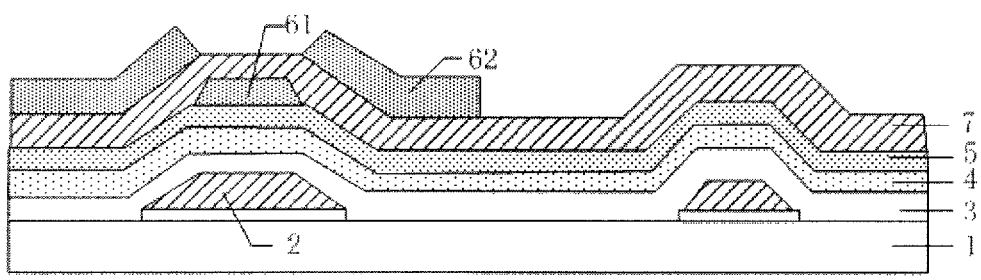

When implementing the manufacturing method, as illustrated in FIG. 3d, a second photoresist (PR) layer film having a certain thickness is deposited by PECVD method on the substrate 1 which has been subjected to Step Three. After one exposing and developing, a second photoresist completely maintained region and a second photoresist completely removed region are obtained; wherein the second photoresist completely maintained region covers the region for a pattern of the source and drain to be formed, and the second photoresist completely removed region exposes other regions except the region for the pattern of the source and drain to be formed; at this time, the photoresist in the second photoresist completely maintained region of the second photoresist layer film can be used as the second etching resist module 62.

Step Five: taking the second etching resist module as a mask, and shielding by the first etching resist module the active layer film and the ohmic contact layer film positioned within the channel region to be formed, performing wet etching process once on the source and drain metallic layer, and forming a pattern comprising the source and drain.

Figure 3E:
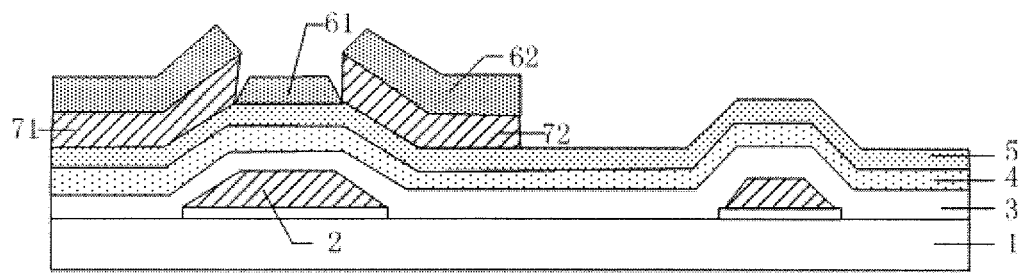

When implementing the manufacturing method, as illustrated in FIG. 3e, the second etching resist module 62 is taken as a mask, and the active layer film and the ohmic contact layer film positioned within the channel region to be formed are shielded by the first etching resist module 61. The source and drain metallic layer film 7 is subjected to one wet etching process in a wet etching apparatus to remove a portion of the source and drain metallic layer film 7 located above the channel region and to remove a portion of the source and drain metallic layer film 7 outside the source and drain region to be formed. A pattern of the source 71 and the drain 72 is formed.

Step Six: taking the first etching resist module and the second etching resist module as mask, etching the ohmic contact layer film outside the channel region to be formed and the region for the pattern of the source and drain to be formed by one dry etching process.

Figure 3F:
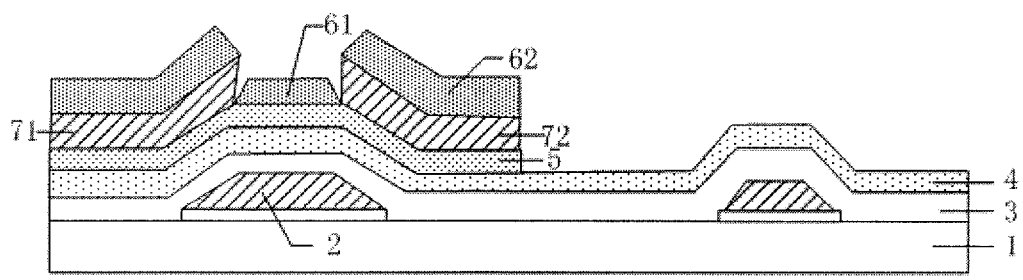

When implementing the manufacturing method, as illustrated in FIG. 3f, in a dry etching apparatus, etching is performed on the ohmic contact layer film 5 outside the channel region to be formed and the region for the pattern of the source and drain to be formed by one dry etching process (after the etching process, residues of the active layer film 4 is left).

Step Seven: removing the first etching resist module.

Figure 3G:
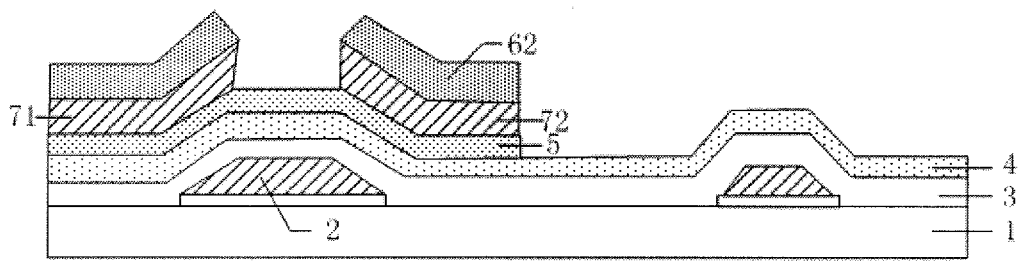

When implementing the manufacturing method, as illustrated in FIG. 3g, in the dry etching apparatus, ashing process is performed on the first etching resist module 61 so as to remove the first etching resist module 61.

Step Eight: taking the second etching resist module as a mask, by one dry etching process, etching the ohmic contact layer film which covers the channel region to be formed, and etching the active layer film outside the channel region to be formed and the region for the pattern of the source and drain to be formed, forming a pattern of ohmic contact layer in the ohmic contact layer film and forming a pattern of active layer in the active layer film.

Figure 3H:
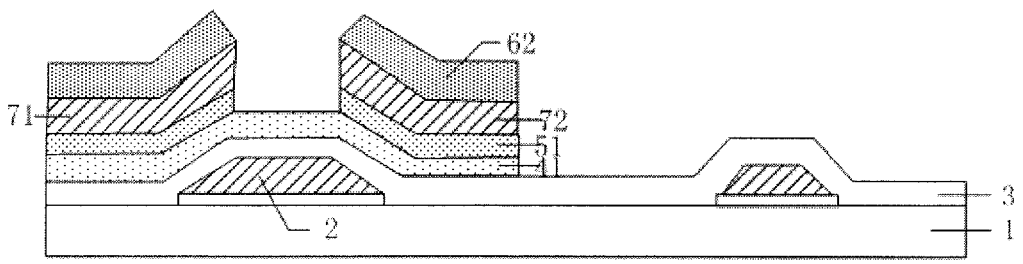

When implementing the manufacturing method, as illustrated in FIG. 3h, in the dry etching apparatus and by one dry etching process, etching is performed on the ohmic contact layer film 5 which covers the channel region to be formed, as well as on the active layer film 4 outside the channel region to be formed and the region for the pattern of the source and drain to be formed. The patterns of the active layer 41 and the ohmic contact layer 51 are formed simultaneously. By controlling the etching condition and duration, the active layer film outside the channel region to be formed and the region for the pattern of the source and drain to be formed can be completely removed by etching exactly at the time when the etching of the ohmic contact layer film which covers the channel region to be formed is finished. Compared with the conventional process, the above steps have advantages of reducing process interval time, saving raw materials, shortening overall time and improving the yield.

Step Nine: peeling off the second etching resist module.

Figure 3I:
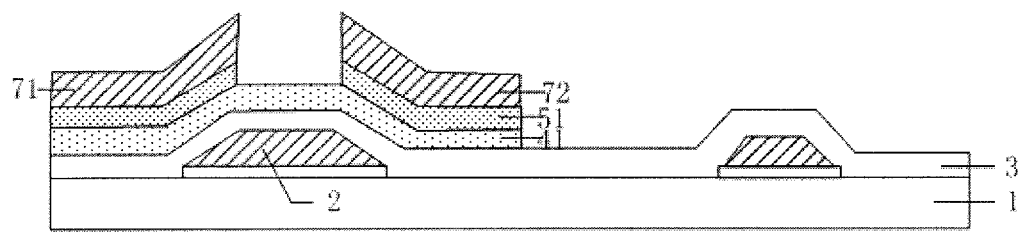

When implementing the manufacturing method, as illustrated in FIG. 3i, in the wet etching apparatus, the second etching resist module 62 on the source 71 and the drain 72 is peeled off.

So far, the manufacturing method of thin film transistor according to the embodiments of the present invention has been described above with reference to Step One to Step Nine by way of example.

Based on an identical inventive concept, at least one embodiment of the present disclosure further provides a thin film transistor. Since the principle of its structure for solving the problem is similar to the above manufacturing method of the thin film transistor, as for the implementation of the structure, the manufacturing method of the thin film transistor can become a reference and a detailed description is omitted to avoid repetition.

Based on an identical inventive concept, at least one embodiment of the present disclosure further provides an array substrate comprising the thin film transistor according to the above embodiments of the present disclosure. Upon implementation, the array substrate according to the embodiments of the present disclosure typically has other layered film structured such as a passivation layer, a planarization layer, pixel electrodes and the like, and structures of gate line, data line, common electrode line and the like are typically formed on the substrate. Such structures can be formed through various ways and are not restricted here.

Based on an identical inventive concept, at least one embodiment of the present disclosure further provides a display device comprising the array substrate according to the above embodiments of the present disclosure. The display device can be any product or component having display function such as cell phone, panel computer, television set, display, laptop, digital photo frame, navigator and etc. Those skilled in the art would appreciate that the display device should have other components, which should not be construed as a limitation of the present disclosure and details of which is omitted here. As for the implementation of the display device, reference can be made to the embodiments of the above array substrate and thin film transistor, details being omitted to avoid repetition.

Embodiments of the present disclosure provide a thin-film transistor and its manufacturing method, an array substrate and a display device. The method comprises: firstly, sequentially forming a pattern of gate, gate insulation layer film, active layer film and ohmic contact layer film on a substrate; and then forming a first etching resist module, which covers a channel region to be formed, on the ohmic contact layer film; and then, forming a source and drain metallic layer film on the substrate formed with the first etching resist module; by use of the first etching resist module, shielding the active layer film and the ohmic contact layer film within the channel region to be formed, forming a pattern containing the source and the drain in the source and drain metallic layer film by wet etching process; finally, by dry etching process, forming a pattern of the ohmic contact layer in the ohmic contact layer film and forming a pattern of the active layer in the active layer film. In the manufacturing method according to the embodiments of the present disclosure, on the basis that the first etching resist module can protect the active layer film within the channel region to be formed, etching of the source and drain metallic layer is performed only by wet etching process. The etching is uniform and problems that the etching is not uniform, the apparatus has a great loss and the yield is low when the source and drain metallic layer is subjected to dry etching process are eliminated.

The foregoing are merely exemplary embodiments of the disclosure, but are not used to limit the protection scope of the disclosure. The protection scope of the disclosure shall be defined by the attached claims.

The present disclosure claims priority of Chinese Patent Application No. 201510601156.X filed on Sep. 18, 2015, the disclosure of which is hereby entirely incorporated by reference as a part of the present disclosure.

The invention claimed is:

1. A manufacturing method of a thin film transistor, comprising:

sequentially forming a pattern of gate, a gate insulation layer film, an active layer film and an ohmic contact layer film on a substrate;

forming a first etching resist module, which covers a channel region to be formed, on the ohmic contact layer film;

forming a source and drain metallic layer film on the substrate formed with the first etching resist module;

forming a pattern comprising a source and drain in the source and drain metallic layer film by wet etching process through shielding the active layer film and the ohmic contact layer film positioned within the channel region to be formed, by use of the first etching resist module; and forming a pattern of an ohmic contact layer in the ohmic contact layer film and forming a pattern of the active layer in the active layer film, by dry etching process.

2. The manufacturing method according to claim 1, wherein forming a first etching resist module, which covers a channel region to be formed, on the ohmic contact layer film comprises:

forming a first photoresist layer film on the ohmic contact layer film, exposing and developing the first photoresist layer film and obtaining a first photoresist completely maintained region and a first photoresist completely removed region;

the first photoresist completely maintained region covers the channel region to be formed, and the first photoresist completely removed region exposes other regions except the channel region;

wherein the photoresist in the first photoresist completely maintained region of the first photoresist layer film is the first etching resist module.

3. The manufacturing method according to claim 2, wherein forming a pattern comprising the source and drain in the source and drain metallic layer film by wet etching process by shielding the active layer film and the ohmic contact layer film in the channel region to be formed by use of the first etching resist module comprises:

forming a second etching resist module, which covers the region for a pattern of the source and drain to be formed, on the source and drain metallic layer film;

taking the second etching resist module as mask, shielding by the first etching resist module the active layer film and the ohmic contact layer film within the channel region to be formed, performing one wet etching process on the source and drain metallic layer, and forming a pattern comprising the source and drain.

4. The manufacturing method according to claim 3, wherein forming the second etching resist module, which covers the region for the pattern of the source and drain to be formed, on the source and drain metallic layer film comprises:

forming a second photoresist layer film on the source and drain metallic layer film, exposing and developing the second photoresist layer film and obtaining a second photoresist completely maintained region and a second photoresist completely removed region;

the second photoresist completely maintained region covers the region for the pattern of the source and drain to be formed, and the second photoresist completely removed region exposes other regions except the region for the pattern of the source and drain to be formed;

wherein the photoresist in the second photoresist completely maintained region of the second photoresist layer film is the second etching resist module.

5. The manufacturing method according to claim 3, wherein forming the pattern of the ohmic contact layer in the ohmic contact layer film and forming a pattern of the active layer in the active layer film by dry etching process comprises:

taking the first etching resist module and the second etching resist module as mask, removing the ohmic contact layer film outside the channel region to be formed and the region for the pattern of the source and drain to be formed through one dry etching process;

removing the first etching resist module;

taking the second etching resist module as mask, by one dry etching process, etching the ohmic contact layer film which covers the channel region to be formed, and etching the active layer film outside the channel region to be formed and the region for the pattern of the source and drain to be formed, forming a pattern of ohmic contact layer in the ohmic contact layer film and forming a pattern of active layer in the active layer film.

6. The manufacturing method according to claim 5, wherein removing the first etching resist module comprises:

performing ashing process on the first etching resist module.

7. The manufacturing method according to claim 5, wherein after forming a pattern of the ohmic contact layer in the ohmic contact layer film and forming a pattern of the active layer in the active layer film, further comprising:

peeling off the second etching resist module.

8. The manufacturing method according to claim 1, wherein forming a pattern comprising the source and drain in the source and drain metallic layer film by wet etching process through shielding the active layer film and the ohmic contact layer film of the channel region to be formed by use of the first etching resist module comprises:

forming a second etching resist module, which covers a region for a pattern of the source and drain to be formed, on the source and drain metallic layer film;

taking the second etching resist module as a mask, shielding by the first etching resist module the active layer film and the ohmic contact layer film in the channel region to be formed, performing one wet etching process on the source and drain metallic layer, and forming a pattern comprising the source and drain.

9. The manufacturing method according to claim 8, wherein forming a second etching resist module, which covers the region for the pattern of the source and drain to be formed, on the source and drain metallic layer film comprises:

forming a second photoresist layer film on the source and drain metallic layer film, exposing and developing the second photoresist layer film and obtaining a second photoresist completely maintained region and a second photoresist completely removed region;

the second photoresist completely maintained region covers the region for the pattern of the source and drain to be formed, and the second photoresist completely removed region exposes other regions except the region for the pattern of the source and drain to be formed;

wherein the photoresist in the second photoresist completely maintained region of the second photoresist layer film is the second etching resist module.

10. The manufacturing method according to claim 8, wherein, by dry etching process, forming a pattern of the ohmic contact layer in the ohmic contact layer film and forming a pattern of the active layer in the active layer film comprises:

taking the first etching resist module and the second etching resist module as mask, removing the ohmic contact layer film outside the channel region to be formed and the region for the pattern of the source and drain to be formed through one dry etching process;

removing the first etching resist module;

taking the second etching resist module as mask, by one dry etching process, etching the ohmic contact layer film within the channel region to be formed, and etching the active layer film outside the channel region to be formed and the region for the pattern of the source and drain to be formed forming a pattern of ohmic contact layer in the ohmic contact layer film and forming a pattern of active layer in the active layer film.

11. The manufacturing method according to claim 10, wherein removing the first etching resist module comprises:

performing ashing process on the first etching resist module.

12. The manufacturing method according to claim 10, wherein after forming a pattern of the ohmic contact layer in the ohmic contact layer film and forming a pattern of the active layer in the active layer film, further comprising:

peeling off the second etching resist module.

13. A thin film transistor manufactured by the manufacturing method according to claim 1.

14. An array substrate comprising the thin film transistor according to claim 13.

15. A display device comprising the array substrate according to claim 14.

* * * * *